United States Patent [19]

Suzuki et al.

[11] Patent Number: 4,775,880
[45] Date of Patent: Oct. 4, 1988

[54] SOLID-STATE IMAGE SENSOR WITH AMORPHOUS SEMICONDUCTOR PHOTOCONDUCTIVE CELL ARRAY

[75] Inventors: Kouhei Suzuki, Yokohama; Toshio Nakai, Tokyo; Kuniaki Anbo; Osamu Shimada, both of Yokohama, all of Japan

[73] Assignee: Kabushiki Kaisha Toshiba, Kawasaki, Japan

[21] Appl. No.: 943,705

[22] Filed: Dec. 19, 1986

[30] Foreign Application Priority Data

Dec. 27, 1985 [JP] Japan .................. 60-293135
Mar. 31, 1986 [JP] Japan .................. 61-72981
Jun. 30, 1986 [JP] Japan .................. 61-151602

[51] Int. Cl.$^4$ .................. H01L 27/14; H01L 23/48
[52] U.S. Cl. .................. 357/30; 357/32; 357/65; 357/68; 358/212; 358/213.27
[58] Field of Search .............. 357/30 G, 30 H, 30 K, 357/30 Q, 2, 32, 65, 68; 358/212, 213, 294; 250/211 J, 578

[56] References Cited

U.S. PATENT DOCUMENTS 4,247,874 1/1981 Kos et al. .................. 358/294
4,288,702 9/1981 Ozawa et al. .................. 357/32

FOREIGN PATENT DOCUMENTS 3506936 2/1985 Fed. Rep. of Germany.
3504369 8/1985 Fed. Rep. of Germany ... 357/30 K

OTHER PUBLICATIONS

Patents Abstracts of Japan, vol. 10, No. 69(E-389)[2126], 18th Mar. 1986; & JP-A-60 218 869, (Canon K.K.), 01-11-1985, FIG. 1-3, Abstract.
Japanese Journal of Applied Physics, vol. 21, Suppl. 21-1, pp. 251-256, "Amorphous Silicon Photoconductive Sensor"; T. Kagawa et al.: 1982.
IEDM Tech. Dig. 1981, pp. 309-312, "A 2048-Element Contact Type Linear Image Sensor for Facsimile"; K. Komiya et al.; 1981.

Primary Examiner—William L. Sikes
Assistant Examiner—Georgia Y. Epps
Attorney, Agent, or Firm—Oblon, Fisher, Spivak, McClelland & Maier

[57] ABSTRACT

A contact type amorphous linear image sensor is disclosed with planar comb-shaped electrodes. Photoelectric converting elements are linearly aligned on a stripe-shaped amorphous silicon layer formed on an insulative substrate. These elements serve as photoconductive cells and are divided into M cell groups. Each cell unit includes N comb-shaped individual cell electrodes and a multi-tooth comb-shaped common electrode, which are spacially meshed or overlapped with each other. A drive voltage detector is connected through a matrix circuit configuration to the cell electrodes, which are arranged such that two-side-ended cell electrodes surround in each cell unit the both side-ended teeth of the corresponding common electrode, so that the adjacent side-ended teeth of the neighboring common electrodes are electrically shielded by the side-ended teeth of the cell electrodes. A signal detecting pre-amplifier is connected to the common electrodes through analog switches and a load resistor.

8 Claims, 4 Drawing Sheets

SOLID-STATE IMAGE SENSOR WITH AMORPHOUS SEMICONDUCTOR PHOTOCONDUCTIVE CELL ARRAY

BACKGROUND OF THE INVENTION

The present invention relates to a solid-state image sensor and, more particularly, to a contact-type image sensor having a cell array of amorphous semiconductor photoelectric converting elements, which are switch-driven using a matrix drive technique.

Amorphous semiconductor image sensors are preferably used for various types of optical image reading equipment such as a facsimile system, an optical code reader, a copying machine, etc., since the use of such image sensors makes it possible to miniaturize the overall size of the equipment. In particular, considerable effort has been given to the development of contact-type solid-state linear image sensors having substantially the same length as the width of documents to be read. Such image sensors offer an advantage over other kinds of imaging devices in that they can eliminate image reduction that uses a lens system before the document image reaches thereto, so that the optical image reading equipment can be made compact in size.

The contact-type amorphous semiconductor image sensor is usually connected to a matrix wiring circuit and switch-driven by a matrix drive technique. In this case, linearly aligned photoelectric converting elements serving as pixels (picture elements) are divided into pixel groups or cell units, which are connected at their first comb-shaped planar electrodes (serving as individual cell electrodes) to an image signal detector, through a matrix wiring circuit consisting of crossed row and column signal line. In each pixel group a second comb-shaped planar electrode is provided to serve as a common electrode therefor. The second comb-shaped planar electrodes of the pixels are connected to a drive voltage generator. The photoelectric converting elements are successively selected with each pixel group as a unit, so that time sequential video signals may be obtained by the image signal detector.

According to the conventional image sensor constructed as described above, however, pixel signal current cannot be effectively prevented from leaking to neighboring signal lines through stray capacitance and/or leak resistance, which is inherently generated between planar electrodes or between the row and column lines of the matrix circuit. When current flowing in a certain signal line is partially leaked to the neighboring signal line, through which another pixel current is to be supplied, the leaked current will serve as a noise current for the image signal obtained from the selected photoelectric converter element. As a result, the signal-to-noise ratio of the image signal is decreased to degrade not only the picture quality of a reproduced video image but also the speed of the image reading operation. This problem remains as a serious bar to the development of compact, high-performance image reading equipment.

SUMMARY OF THE INVENTION

It is therefore an object of the present invention to provide a new and improved solid-state image sensor which can read an input paper document to produce a high-quality image signal at high speed.

In accordance with the above object, the present invention is addressed to a specific solid-state image sensor which has a plurality of photoelectric converting elements serving as photosensitive cells of the image sensor. These photoelectric converting elements are linearly aligned on a substrate in such a manner as to be divided into a second number of cell groups. The photoelectric converting elements have an amorphous semiconductor layer formed on the substrate, first comb-shaped electrodes formed on the amorphous semiconductor layer to define the photosensitive cells, and second comb-shaped electrodes also formed on the amorphous layer in such a manner that each second electrode is spacially meshed with the first electrodes included in the corresponding cell group to serve as a common electrode therefor.

A signal readout unit is connected to the photosensitive cells, for sequentially selecting a cell unit from among the photoelectric converting elements to produce a time sequential image signal. The signal readout device has a drive voltage generator for applying an electric drive voltage to the photoelectric converting elements, and a signal detector for detecting image signals sequentially supplied from the photoelectric converting elements to produce an electrical video image signal. It should be noted that the drive voltage generator is connected to either the first comb-shaped electrodes or the second comb-shaped electrodes, which surround both side end tooth portions of the other electrode group in each cell unit. The one electrode group thus includes two neighboring comb-shaped electrodes respectively belonging to two adjacent cell groups and having tooth portions positioned at the side end portion thereof to directly face each other. The signal detector is connected to the other electrode group. In the above configuration, since the drive voltage generator is connected to comb-shaped electrodes having directly facing tooth portions, the leaking current can be minimized to attain the above object.

The invention, and its objects and advantages, will become more apparent in the detailed description of a preferred embodiment presented below.

BRIEF DESCRIPTION OF THE DRAWINGS

In the detailed description of the preferred embodiment of the invention presented below, reference is made to the accompanying drawings in which.

DETAILED DESCRIPTION OF THE PREFERRED EMBODIMENTS

Figure 1:
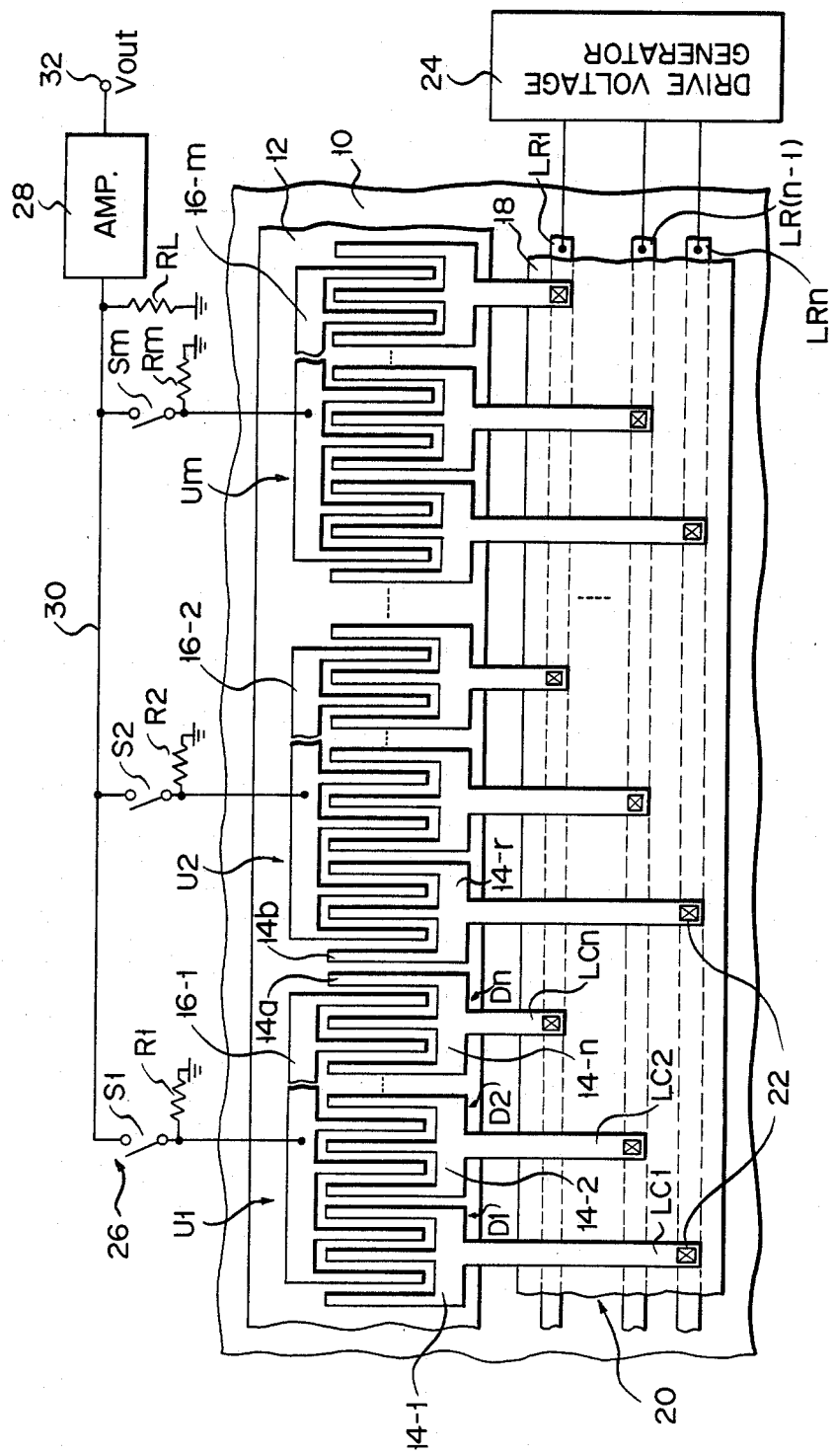
FIG. 1 shows a partial plan view of the main part of a contact-type linear image sensor and peripheral circuit arrangement associated therewith, in accordance with a first embodiment of the present invention.

There is shown in FIG. 1 of the drawings a contact-type linear image sensor with a pixel array of photoelectric converting elements, which are linearly aligned over an insulative substrate 10 to serve as photoconductive cells (picture elements). On substrate 10, a stripe-shaped amorphous semiconductor (amorphous silicon) layer 12 is formed in a first surface area thereof to serve as an electric converting layer for the image sensor. Photoconductive cells D are formed on amorphous silicon layer 12 in such a manner as to be divided into M cell groups (or cell units) each consisting of N cells D1, D2, ..., D(M×N). In this embodiment, number M is set to 54 and N is 32 (total cell number is 1,728) in order to obtain the image resolution of 8 pixels/mm for an A4-sized paper document.

Planar-type metallic cell electrodes 14 and 16 are formed on layer 12. More specifically, M×N comb-shaped electrodes 14, each of which has three tooth portions and a stem portion LC, are linearly positioned on amorphous silicon layer 12 to define an array of cells D1, D2, ..., D(M×N). These electrodes 14 serve as individual cell electrodes. M comb-shaped electrodes 16, each of which has multi-numbered tooth portions, are provided on layer 12 in such a manner that each comb-shaped electrode 16 is spacially meshed or overlapped with N comb-shaped electrodes 14, which are included in one cell unit Ui (i=1, 2, ... or m), as shown in FIG. 1. (The suffixes 1, 2, ... will be used for other elements as well. Where it is not necessary to distinguish, the suffixes may be dropped in the following description.) M comb-shaped electrodes 16 may thus serve as common electrodes for N cells D1, D2, ..., Dn included in each cell unit Ui. The planar electrode pattern may be easily fabricated by standard photolithographic technology.

Stem portions LC of the corresponding comb-shaped individual cell electrodes included in different cell units U1, U2, ..., Um have the same length, as shown in FIG. 1, suitable for the formation of an M×N matrix circuit configuration on substrate 10. A stripe-shaped insulative layer 18 is formed over the substrate in a second surface area thereof, such that amorphous silicon layer 12 is aligned in parallel with insulative layer 18. Between substrate 10 and insulative layer 18 are provided N parallel signal lines LR1, ..., LRn which may function as row lines of matrix circuit configuration 20. Stem portions LC1, LC2, ..., LCn of comb-shaped individual cell electrodes 14 of each cell unit Ui are formed on stripe-shaped insulator 18 in such a manner that they are electrically crossed with row signal lines LR1, ..., LRn. In this matrix circuit 20, M stem portions LC of the corresponding comb-shaped individual cell electrodes included in different cell units U1, U2, ..., Um are electrically connected with the same row line through contact holes 22 formed in insulator 18. These stem portions LC1, LC2, ..., LCn of individual cell electrodes 14 of each cell unit Ui may thus serve as column signal lines in matrix circuit 20.

A drive voltage generating circuit 24 is connected to row signal lines LR of matrix circuit 20, which are connected to individual cell electrodes 14. Circuit 24 generates an electrical drive voltage signal required to sequentially drive individual cell electrodes included in a cell unit Ui (i=1, 2, ..., m).

A signal detecting circuit, which is generally designated by reference numeral "26" in FIG. 1, is connected directly to comb-shaped common electrodes 16-1, 16-2, ..., 16-m. Signal detector 26 includes a pre-amplifier 28 for reading out an image signal from cells. Pre-amplifier 28 is connected via M analog switches S1, S2, ..., Sm to common electrodes 16 of cell units U1, U2, ..., Um. Analog switches S1, S2, ..., Sm are connected at their first terminals to a signal output line 30 connected to signal reading pre-amplifier 28. Analog switches S1, S2, ..., Sm are connected at their second terminals not only directly to common electrodes 16 but also to the ground through resistors R1, R2, ..., Rm. These resistors R1, R2, ..., Rm may function as pull-down resistors for fixing the electrical potential of non-selected common electrodes 16 connected to nonconductive analog switches. A load resistor RL is provided at one end of pre-amplifier 28, to which common electrodes 16 are connected through switches S. The other end of pre-amplifier 28 is connected to an output terminal 32 of this image sensing system.

Careful attention should be paid to the fact that comb-shaped individual cell electrodes 14 connected to drive voltage generator 24 are spacially meshed, on amorphous semiconductor layer 12, with the corresponding comb-shaped common electrodes 16 in a specific manner as described below. Two individual comb-shaped electrodes, 14-n and 14-1', for example, which respectively belong to two neighboring cell units (U1 and U2, for example) and which are positioned at the side ends thereof to be adjacent to each other, are arranged to have two adjacent side-ended teeth 14a and 14b facing directly to each other as shown in FIG. 1. No teeth of common cell electrode are positioned between tooth 14a of right-ended cell electrode 14-n of cell unit U1 and tooth 14b of left-ended cell electrode 14-1' of cell unit U2. In other words, when it is cell electrodes 14 that are connected to drive voltage generator 24, these electrodes 14 included in each cell unit U1, U2, or Um are arranged to surround the corresponding common electrode 16. In such a planar electrode pattern, two adjacent teeth 14a and 14b of neighboring cell electrodes 14-n and 14-1' are extended between a left side-end tooth of common electrode 16-1 and a right side-ended tooth of common electrode 16-2, to thereby serve as a shielding electrode for the neighboring common electrodes 16, so that current leak can be prevented between these neighboring common electrodes.

Figure 2:
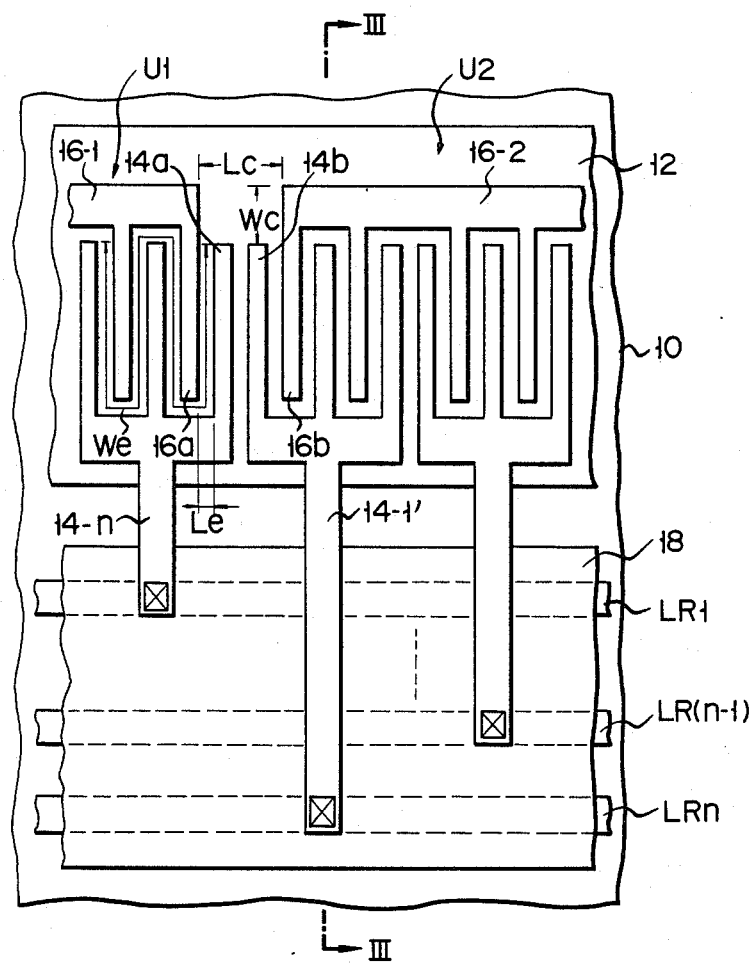
FIG. 2 is an enlarged partial plan view of the contact-type linear image sensor shown in FIG. 1.

Referring now to FIG. 2, side end portions of two neighboring common electrodes 16-1 and 16-2 are enlarged illustrate more clearly the aforementioned planar electrode pattern arrangement. Directly facing side-end teeth 14a and 14b of adjacent cell electrodes belonging to different cell units (U1 and U2, for example) are provided between right side end tooth 16a of first common electrode 16-1 and left side end tooth 16b of second common electrode 16-2. No teeth of the common electrode are positioned between cell teeth 14a and 14b connected to drive voltage generator 24. In other words, both end teeth of each common electrode 16 connected to signal detector 26 are arranged such that they are surrounded by teeth of individual cell electrodes included in the same cell unit and connected matrix circuit 20 to drive voltage generator 24.

The planar arrangement of teeth 14a, 14b, 16a and 16b is preferably determined so as to satisfy the following condition:

$$L_c/W_c \gg L_e/W_e$$

where,
  $L_c$: a horizontal distance between neighboring common electrodes
  $W_c$: vertical distance between top end of cell tooth 14a or 14b and the upper end line of common electrodes 16

Le: a gap width defined between comb-shaped cell electrodes 14 and the corresponding comb-shaped common electrode 16 in each cell unit We: the total length of inner path defined between three teeth of a comb-shaped cell electrode 14 and those of the corresponding comb-shaped common electrode 16

Figure 3:
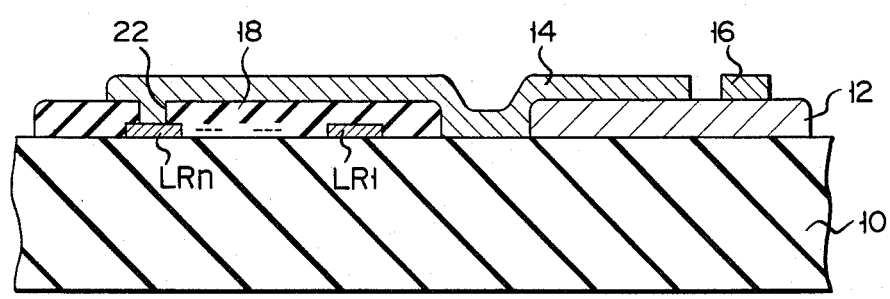
FIG. 3 shows a cross-sectional view of the image sensor along line III—III of FIG. 2.

FIG. 3 shows a cross-sectional view of the image sensor along line III—III (not drawn to scale). Stripe-shaped amorphous semiconductor layer 12 and row signal lines LR1, ..., LRn for the matrix circuit 20 are formed on insulative substrate 10. Stripe-shaped insulative layer 18 is formed on insulative substrate 10 to cover row signal lines LR. A three-tooth comb-shaped individual cell electrode 14 has a stem portion which extends onto insulative layer 18 and is connected to the corresponding row line LR through contact hole 22 formed in insulative layer 18.

Figure 4:
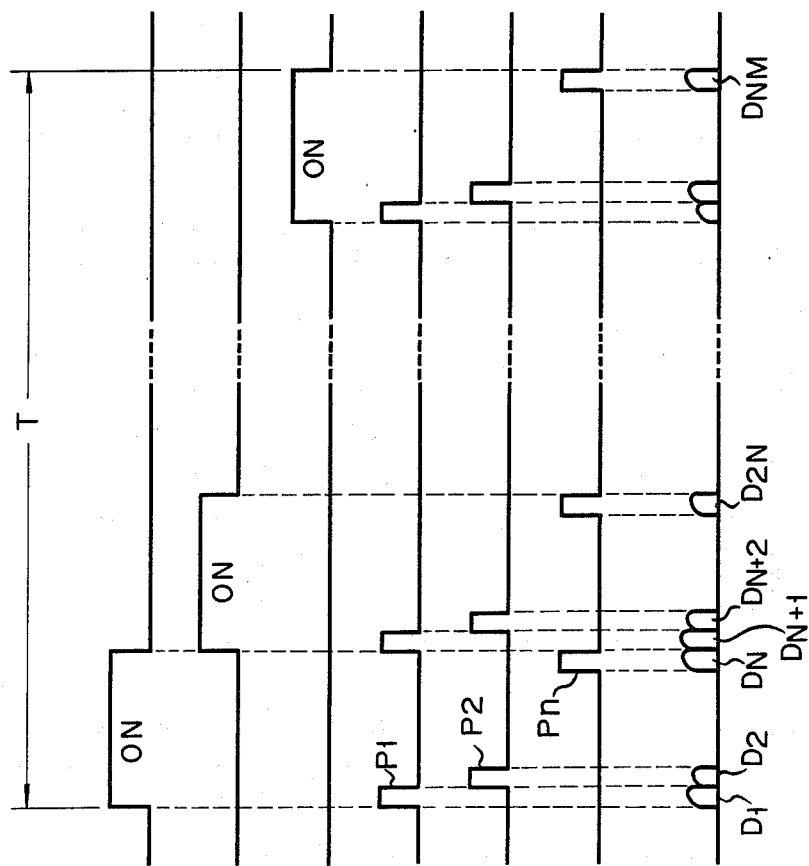
FIGS. 4A to 4G show waveforms of signals generated in the main parts of the image sensor system shown in FIG. 1.

The operation mode of the contact-type linear image sensor will now be described hereinafter. When applied to a facsimile system, the image sensor is moved in a column direction of an input document paper to sequentially sense rows of linear images. During this operation, the photoconductive cells of each cell unit Ui (i=1, 2, ..., m) of the linear cell array are supplied with drive pulse voltages by drive voltage generator 24. When reading out image signals sensed by these photoconductive cells, analog switches S1, S2, ..., Sm are sequentially rendered conductive, as shown in FIGS. 4A to 4C, in one line readout period T. Noted that the phrase "one line readout period T" stands for a period required to complete the signal readout operation with respect to M×N cells (an array of photoconductive cells) illustrated in FIG. 1. When a switch (S1, for example) is rendered conductive for a constant time to select one cell unit (U1), the remaining switches (S2, ..., Sm) are rendered nonconductive, so that the other cell units (U2, ..., Um) are kept unselected. In this manner, cell units are sequentially selected by the sequential switching operation of analog switches S.

While one switch (S1, for example) is conductive to connect a common electrode (16-1, for example) of the corresponding cell unit (U1) to pre-amplifier 28 of signal detector 26, drive pulses P1, P2, ..., Pn are sequentially supplied from drive voltage generator 24 through the matrix circuit 20 to the N individual cell electrodes (14-1, 14-2, ..., 14-n) of the same cell unit, as shown in FIGS. 4D to 4F, in synchronism with the ON period of the conductive switch (S1). Therefore, photoconductive cells (D1, D2, ..., Dn) in the selected cell unit generates, in response to the sequential application of the drive pulses P, pixel image current signals, which are then sequentially supplied to common signal output line 30 and load resistor RL. Pre-amplifier 28 detects voltage change at one end of load resistor RL and amplifies the same to produce a video image signal representative of one document line image output from one cell unit in a serial manner. The above signal readout operation will be repeated with respect to every cell unit in the same manner, thereby producing at output terminal 32 a full line image signal Vout of the input document paper, whose waveform is illustrated in FIG. 4G.

In the contact-type linear image sensor mentioned above, those comb-shaped electrodes which are connected to drive voltage generator 24 through matrix circuit configuration 20 (i.e., the comb-shaped electrodes referred to as individual cell electrodes 14 in the above embodiment) are arranged in the following fashion: In each cell unit, the comb-shaped electrodes surround the teeth located at the both side ends of the corresponding electrodes (i.e., common electrodes 16 referred to in this embodiment). That is, the two teeth located at the rightmost and leftmost side ends of common electrode 16 are surrounded. Due to this arrangement, the teeth of the individual cell electrodes (such as the teeth denoted by 14a and 14b) never fail to exist between the tooth at the rightmost or leftmost side end of common electrode 16 of each cell unit and the tooth at the corresponding side end of common electrode 16 of the adjacent cell unit. Therefore, the teeth at the rightmost and leftmost side ends of common electrodes 16 of the adjacent two cell units can be prevented from being located close to each other. The cell electrode teeth interposed between the teeth at the side ends of common electrodes of the adjacent two cell units (e.g., teeth 14a and 14b) serve as a shielding electrode for the adjacent cell units, so that the stray capacitance and the leak resistance between the two cell units can be minimized, thereby reliably preventing the current leakage between the two cell units. When pixel currents are sequentially read out from a selected cell unit during the time sequential image signal readout operation, they are prevented from undesirably leaking to the common electrode of the adjacent non-selected cell unit. Therefore, it is possible both to remarkably improve the signal-to-noise ratio of the readout image signal and to increase the speed at which the signals are read out.

The inventors actually made an image sensor having the construction shown in FIGS. 1 to 3, and measured the stray capacitance of each portion of this image sensor. As a result, it was confirmed that the stray capacitance of common electrodes 16 was in a very low range of 2 to 3 pF, whereas the stray capacitance of the row and column lines (i.e., the matrix circuit) was in a high range of 40 to 100 pF. This means that the time constant at the time of reading a signal per pixel is small (1/13 to 1/50), provided that the value of load resistance RL is constant. Accordingly, the operation speed can be improved. From this fact, it is evident that the operation speed of the subject image sensor is very high, as noted above.

When the comb-shaped electrodes and the peripheral circuits are arranged and connected in the manner mentioned above, it is possible to improve the manufacturing yield of an image sensor that uses amorphous silicon as a photoconductive material of the photoconductive cells. The reason is that individual cell electrodes 14 are connected to drive voltage generator 24 through matrix wiring circuit 20, so that a readout signal never flows to matrix wiring circuit 20. Generally speaking, the resistance of the photoelectric converting elements of an amorphous silicon image sensor exceeds 50 megaohms in the "light" condition and exceeds 1 gigaohm in the "dark" condition. Therefore, in a prior art image sensor, in which a drive pulse voltage is applied directly to the common electrodes of cell units and a readout signal current flows to a signal detector through a matrix wiring portion, the matrix wiring circuit must have a large leak resistance between adjacent layers, in accordance with the larger value which the resistance of the photoelectric converting elements may take. Due to this, the manufacturing yield of the prior art image sensor is inevitably low. According to the present invention, in contrast, a readout signal current does not flow to matrix wiring circuit 20, as noted above, so that the leak resistance can be reduced as low as 10 kiloohms. In addition, common line 30, which is of a single layer pattern and to which a readout signal current is supplied from the cells, has a sufficiently large leak resistance, so that the amount of current leaking from the non-selected cells is extremely small. It is, therefore, possible to further improve the signal-to-noise ratio of a reproduced image.

Figure 5:
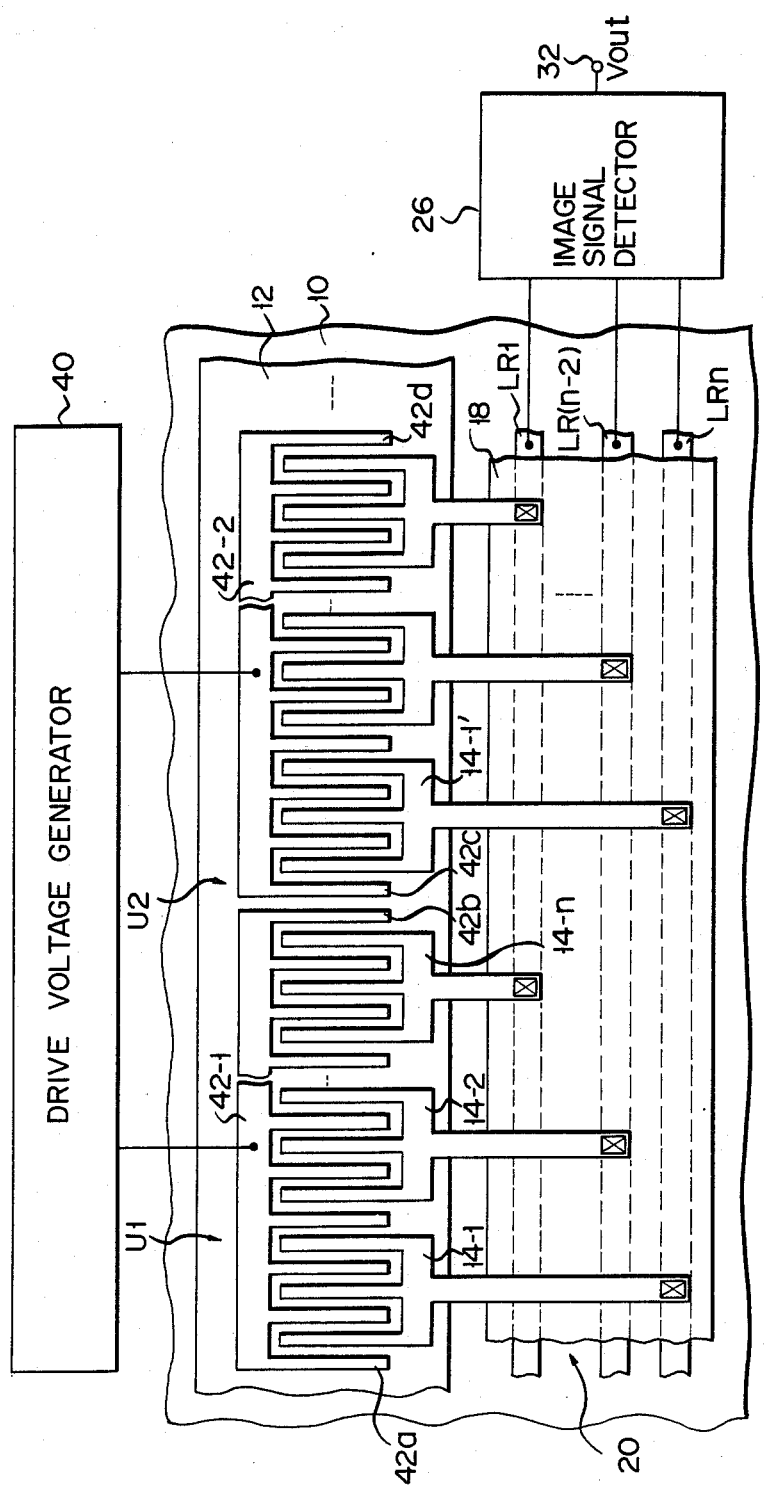
FIG. 5 shows a partial plan view of a contact-type linear image sensor and peripheral circuit arrangement, in accordance with a second embodiment of the present invention.

FIG. 5 shows a contact-type linear image sensor in accordance with a second embodiment of the present invention, wherein the same reference numerals are used to designate the same elements or components as in the first embodiment shown in FIGS. 1 to 3. This image sensor is different from the first embodiment device in that drive voltage generator 40 is connected not to individual cell electrodes 14 but to multi-tooth comb-shaped electrodes serving as common electrodes 42, which are formed on amorphous semiconductor layer 12 to have their side-ended teeth 42a and 42b (42c and 42d) which surround in each cell unit the both side-ended cell electrodes 14-1 and 14-n.

A plurality of (M) cell units U1, U2, ... (cell unit Um is not shown in FIG. 5) are provided on amorphous semiconductor layer 12. Each cell unit Ui (i=1, 2, ... or m) includes N three-tooth comb-shaped planar electrodes 14-1, 14-2, ..., 14-n functioning as individual cell electrodes and common electrode 42-i (i=1, 2, ... or m) to thereby define an array of M×N photoconductive cells. Stem portions of cell electrodes 14-1, 14-2, ..., 14-n in each cell unit Ui are connected to row signal lines LR1, LR2, ..., LRn of matrix circuit configuration 20 in the same manner as in the first embodiment image sensor shown in FIG. 1. Row lines LR are connected directly to image signal detector 26 having a load resistor and a pre-amplifier, which are not shown in FIG. 5. Attention should be given to the fact that it is common in the first and second embodiment devices that drive voltage generator 40 is connected to one group of planar electrodes, cell electrodes or common electrodes, which have both their side-ended teeth surrounding the side-ended teeth of the other group of electrodes.

When reading out pixel image signal current from photoconductive cell array, drive voltage generator 40 generate drive pulse voltages, which are then sequentially applied to common electrodes 42. When a first cell unit U1 is selected, pixel image signal currents are read out from cell electrodes 14-1, 14-2, ..., 14-n and supplied through matrix circuit configuration 20 to image signal detector 26, so that line video image signal Vout may be obtained at output terminal 32. Signal currents from non-selected neighboring cell unit U2 can be prevented from leaking to those of selected cell unit U1, since the teeth of both side-ended cell electrodes 14-1 and 14-n are surrounded by both side-ended teeth 42a and 42b of common electrode 42-1, so that adjacent cell electrodes 14-n and 14-1' belonging to neighboring cell units U1 and U2 are electrically shielded by common electrode teeth 42b and 42c. Accordingly, also in the second embodiment, current leak can be effectively eliminated between neighboring cell units U during the image signal readout operation to thereby make it possible to improve the quality of reproduced image signal.

Although the invention has been described with reference to specific embodiments, it should be understood by those skilled in the art that numerous modifications may be made within the spirit and scope of the inventive contribution.

For example, in FIG. 1, analog switches S are arranged such that each common node of switch (Si=1, 2, ... or m) and the corresponding common electrode 16-i is connected to the ground through pull-down resistor Ri. When analog switches are rendered nonconductive, the corresponding common electrodes (non-selected common electrodes) are connected to the ground through pull-down resistors R. Such the arrangement may be modified in such a manner that the non-selected common electrodes are directly connected to the ground during the signal readout operation. In that case, a double-throw switch is preferably used for each of the analog switches S switch between a first contact connected to common signal output line 30 and a second contact connected to the ground without a pull-down resistor.

Further, in the image sensors of the above embodiments, the photoelectric converting elements are constituted by photoconductive elements alone. However, the image sensors may use a cell array in which a photoconductive element and an isolation diode are connected in series. Further, the image sensors may use an array of photoelectric converting elements, in which a photodiode (photoelectromotive element) and an isolation diode are connected in series. Still further, the substrate may be formed to be transparent, so as to read signals from the reverse side of the substrate. In short, the present invention can be applied to all image sensors as long as they are of the matrix drive type. In addition, in the above embodiments, the row and column lines are constituted by different layers, but only the intersections of these lines may be formed to to have a crossover construction.

What is claimed is:

1. A solid-state image sensor comprising:
(a) a substrate;
(b) an elongated amorphous semiconductor layer formed on said substrate in a first area thereof;
(c) a first number of photoelectric converting elements linearly aligned on said amorphous semiconductor layer, for serving as a linear array of photosensitive cells of said image sensor which are divided into a second number of cell units, said photoelectric converting elements having, first comb-shaped electrodes formed on said amorphous semiconductor layer to define said photosensitive cells, and second comb-shaped electrodes also formed on said amorphous semiconductor layer in such a manner that each second electrode is spacially meshed with the first electrodes included in the corresponding cell unit to serve as a common electrode therefor said first comb-shaped electrodes including two neighboring comb-shaped electrodes which respectively belong to two adjacent cell units and which have tooth portions positioned at the side end portions thereof and adjacent directly to each other; and (d) signal readout means connected to said photoelectric converting elements, for sequentially selecting a cell unit from among said cell units to produce a time sequential image signal, said signal readout means comprising:

first signal lines formed on said substrate in a second area thereof and extending along said semiconductor layer, second signals lines insulatively provided over said first signal lines to be crossed together so as to form a matrix circuit configuration, drive voltage generator means connected to said second comb-shaped electrodes through said matrix circuit configuration, for applying an electric drive voltage to said photoelectric converting elements, and signal detector means connected to said first comb-shaped electrodes, for detecting image signals sequentially supplied from said photoelectric converting elements to produce an electrical video signal.

2. The image sensor according to claim 1, wherein said first comb-shaped electrodes include in each cell unit, two comb-shaped electrodes which are positioned at opposite ends of said each cell unit and which are meshed with the corresponding second comb-shaped electrode so as to substantially surround end tooth portions thereof.

3. The image sensor according to claim 2, wherein said drive voltage generator means is connected through said matrix circuit configuration to said first comb-shaped electrodes, and said signal detector means is connected to said second comb-shaped electrodes.

4. The image sensor according to claim 1, wherein said second comb-shaped electrodes include in each cell unit a multi-tooth comb-shaped common electrode which substantially surround tooth portions of two comb-shaped first electrodes positioned at the both side ends of each cell unit.

5. The image sensor according to claim 4, wherein said drive voltage generator means is connected to said second comb-shaped electrodes, and said signal detector means is connected through said matrix circuit configuration to said first comb-shaped electrodes.

6. The image sensor according to claim 1, wherein said substrate comprises an insulative layer.

7. A solid-state linear image sensor comprising:
(a) an elongated substrate having first and second surface areas defined along a longitudinal direction thereof;
(b) a stripe-shaped amorphous semiconductor layer formed on said substrate in said first surface area;
(c) a linear array of photoelectric converting elements formed on said semiconductor layer, for serving as photosensitive cells of said image sensor which are divided into cell units, said photoelectric converting elements having, comb-shaped individual cell electrodes formed on said semiconductor layer, for defining said cells, and comb-shaped common cell electrodes provided for said cell units respectively, said common electrodes being formed on said semiconductor layer, and spacially meshed with said individual electrodes in such a manner that two end tooth portions of two neighboring individual electrodes which respectively belong to two adjacent cell units are positioned between common electrodes of said two adjacent cell units, thereby preventing current leakage between said two adjacent cell units; and (d) signal readout means connected to said photoelectric converting elements, for sequentially selecting a cell unit from among said cell units to produce a time sequential image signal, said signal readout means comprising, a matrix circuit formed on said substrate in said second surface area, drive voltage generator means connected to said individual cell electrodes through said matrix circuit, for applying an electric drive voltage to said photoelectric converting elements, and signal detector means connected to said common cell electrodes, for detecting image signals sequentially supplied from said photoelectric converting elements to produce an electrical video signal.

8. The image sensor according to claim 7, wherein said two adjacent cell units comprise:

a first cell unit having a first common cell electrode with an end tooth portion and a linear array of n individual cell electrodes, and a second cell unit having a second common cell electrode with an end tooth portion adjacent to the end tooth portion of said first common electrode and a linear array of n individual cell electrodes, and wehrein an n-th individual cell electrode of said first cell unit has tooth portions surrounding the end tooth portion of said first common electrode, while a first individual cell electrode of said second cell unit has tooth portions surrounding the end tooth portion of said second common electrode.

* * * * *